United States Patent [19]
Arai et al.

[11] Patent Number: 5,443,662
[45] Date of Patent: Aug. 22, 1995

[54] METHOD OF FORMING A NITRIDE OR CARBONITRIDE LAYER

[75] Inventors: Tohru Arai; Kazuyuki Nakanishi; Hiromasa Takeda; Hideo Tachikawa, all of Aichi, Japan

[73] Assignee: Kabushiki Kaisha Toyota Chuo Kenkyusho, Aichi, Japan

[21] Appl. No.: 84,322

[22] Filed: Jun. 30, 1993

Related U.S. Application Data

[63] Continuation of Ser. No. 740,943, Aug. 6, 1991, abandoned.

[30] Foreign Application Priority Data

Aug. 10, 1990 [JP] Japan ................. 2-211811

[51] Int. Cl.$^6$ .................. C23C 16/44; B05D 1/22
[52] U.S. Cl. ................ 148/209; 427/245; 427/255.2; 427/255.4
[58] Field of Search ............ 148/209; 427/249, 255.2, 427/255.4

[56] References Cited

U.S. PATENT DOCUMENTS

| | | | |
|---|---|---|---|
| 4,569,862 | 2/1986 | Arai et al. | 427/249 |
| 4,623,400 | 11/1986 | Japka | 148/6.35 |
| 4,686,117 | 8/1987 | Arai et al. | 427/255.4 |
| 4,765,847 | 8/1988 | Arai | 148/15.5 |
| 4,844,949 | 7/1989 | Arai et al. | 427/249 |
| 4,871,401 | 10/1989 | Arai | 148/14 |
| 4,892,759 | 1/1990 | Arai et al. | 427/255.2 |

FOREIGN PATENT DOCUMENTS

| | | |
|---|---|---|
| 166216 | 1/1986 | European Pat. Off. . |
| 252480 | 1/1988 | European Pat. Off. . |
| 303191 | 2/1989 | European Pat. Off. . |
| 55065357 | 11/1978 | Japan ............ C23C 11/08 |
| 55164072 | 6/1979 | Japan ............ C23C 11/08 |

OTHER PUBLICATIONS

Archer, *Wear*, 48, 237–250, 1978; "Chemical Vapor Deposited Tungsten Carbide Wear-Resistant Coatings Formed at Low Temperatures".

*Primary Examiner*—Deborah Yee
*Attorney, Agent, or Firm*—Jacobson, Price, Holman & Stern

[57] ABSTRACT

A nitride or carbonitride layer is formed on the surface of a metal material as follows: A treating agent composed of a refractory powder of alumina or the like and a powder of a metal for forming a nitride or a carbide or an alloy thereof is disposed in a fluidized bed furnace; the treating agent is fluidized to form a fluidized bed by introducing an inert gas; the fluidized bed furnace is heated to a temperature of not higher than 700° C.; an activator of a halogenated ammonium salt is intermittently supplied into the fluidized bed at a rate of 0.001 to 5 wt %/hour based on the total amount of the treating agent; and the metal material to be treated is disposed in the fluidized bed during or after any of the above steps. For example, a nitride layer composed of only a metal for forming a nitride which contains almost no Fe—N is formed on the surface of iron steel even at a temperature as low as not higher than 700° C. The layer is very hard and efficient in wear resistance, and the toughness of the base metal is hardly lowered.

8 Claims, 8 Drawing Sheets

METHOD OF FORMING A NITRIDE OR CARBONITRIDE LAYER

This application is a continuation of application Ser. No. 07/740,943, filed Aug. 6, 1991, now abandoned.

BACKGROUND OF THE INVENTION

1. FIELD OF THE INVENTION

The present invention relates to a method for surface treatment for easily forming a layer of a nitride or carbonitride which does not substantially contain iron nitride: (referred to as "Fe—N" hereinafter), at a temperature of not higher than 700° C. on the surface of metal materials which are used for dies, jigs, machine parts and the like.

2. DESCRIPTION OF THE RELATED ART

It is known that metal materials (referred to as "materials to be treated" hereinafter) are improved in wear resistance, seizure resistance, oxidation resistance, corrosion resistance, etc. when they are coated with a surface layer of a nitride or carbonitride such as chromium (Cr) and titanium (Ti). Several methods have been proposed for forming the surface layer. One of them is a method of coating a material to be treated with a surface layer of a nitride or carbonitride of Cr, vanadium (V), Ti, etc., by the aid of plasma CVD (chemical vapour deposition) using a halide of Cr, V, Ti or the like (For example, Japanese Patent Laid-open Nos. 65357/1980 and 164072/1980). This method enables a surface layer to be formed without causing a heat-induced strain to the base metal of the materials to be treated because the treatment is carried out in the temperature range of lower than 700° C., which is the Ac, transformation point of iron. This method, however, is disadvantageous in that it is difficult to form a surface layer excellent in throwing power of electrolytic colouring: and adhesion. It is also disadvantageous in that the treatment requires a high-purity and expensive metal halide, such as titanium tetrachloride ($TiCl_4$), as a constituent of the surface layer. Since such a metal halide has a sufficiently strong reactivity to corrode a reactor or pipes, and is also toxic, it is difficult to handle. The treatment therefore requires a complicated process and an expensive apparatus. In addition, since it is necessary to carry out the treatment in hydrogen or under a reduced pressure, the method is poor in efficiency.

In the ordinary heat CVD without using plasma, a low-temperature CVD for forming a coating layer of a carbide or nitride of tungsten (W) at a temperature of 350° to 700° C. has been proposed. (N. J. Archer (Wear) 48, 1979, P. 237)

In this method, tungsten hexafluoride ($WF_6$), hydrogen ($N_2$), hydrocarbon, and argon (Ar) are introduced into a reactor and reacted at the above-described temperature so as to form tungsten carbide ($W_3C$, $W_2C$) on the surface of the material to be treated, or $WF_6$, $H_2$, ammonia ($NH_3$), and Ar are reacted so as to form tungsten nitride ($W_2N$) on the surface of the material to be treated. In this method, $WF_6$ used is difficult to handle because of its corrosiveness and toxicity. Since $H_2$ is used in this method, the furnace cannot be freely opened or closed so that it is impossible to insert and take out the material to be treated with efficiency. Furthermore, no industrially useful coating layer has been obtained by using-elements other than W.

On the other hand, a surface treatment by CVD using a fluidized bed furnace has, been proposed (Japanese Patent Laid-open No. 243178/1980 corresponding to U.S. Pat. No. 4,623,400). This proposal is quite different from the present invention in structure and effect. In the former case, inert particles (particles of alumina or the like which do not participate directly in a reaction for forming a surface layer) are used for a fluidized layer (also called a fluidized bed) and a metal halide is used for the material forming the surface layer. The metal halide is mixed with an inert, gas, introduced into the fluidized bed from the lower part of a dispersion plate (also called a metal diffuser plate) which is placed directly under the fluidized bed, and mixed and reacted with a reacting gas, such as ammonia supplied directly into the fluidized bed without passing through the diffuser plate, thereby forming a nitride or the like on the surface of the material to be treated which is buried in the fluidized bed.

In this method, the fluidized bed itself is inert and it has no direct chemical act on the reaction for forming the surface layer. The fluidized bed also is neutral and it has a role as a mere heating medium. The reaction itself is therefore substantially the same as the known CVD reaction, both reactions having the same characteristic features.

Since the metal halide is introduced into the fluidized bed from the lower part of the diffuser plate, immediately after the gas of the metal halide enters the fluidized bed, which is above the diffuser plate, the metal halide starts reacting with the reacting gas, and a nitride or the like is deposited on the surface of the inert particles which constitute the fluidized bed. This causes a large consumption of the metal halide and a lack of the gas of the metal halide which should reach the surface of the material being treated. When a nitride or the like is formed on the surface of the inert particles, the adhesion of each inert particle increases and the fluidity is prone to be lowered. Furthermore, an extreme variation in the gas concentration of the metal halide is caused from the lower part to the upper part of the fluidized bed and it is difficult to obtain the uniformity of layer thickness in the fluidized bed. In addition, since the metal halide, which has strong corrosiveness passes through the diffuser plate, the diffuser plate is corroded and the life thereof is shortened. Even an adoption of a method for preventing the corrosion wherein the metal halide is directly introduced into the fluidized bed through a pipe or the like, instead of the diffuser plate, in the same way as a reacting gas, such as $NH_3$, makes it more difficult to obtain the uniformity of the layer thickness in the fluidized bed.

Accordingly, the above-described proposal which uses inert particles and a metal halide (Japanese Patent Laid-open No. 243178/1986 corresponding to U.S. Pat. No. 4,623,400) cannot be an industrially practical method for forming a surface layer.

In order to overcome the disadvantages of the conventional methods for surface treatment, the present inventors achieved an invention relating to surface treatment which is characterized by forming a surface layer of a nitride or carbonitride: of Cr, V, Ti or the like on the surface of an iron or an iron alloy material, which is a material to be treated, at a temperature of not higher than 650° C. (Japanese Patent Laid-open No. 128164/1988 corresponding to U.S. Pat. No. 4,871,401). According to this method, a material to be treated is inserted into a treating agent composed of a refractory powder of alumina or the like, a material containing Cr, V, or Ti, and a halogenated ammonium salt and/or a metal halide, which is fluidized by a nitrogen (N)-containing gas or the like, and heat-treated at a temperature of not higher than 650° C., so as to form a surface layer composed of a nitride or carbonitride of Cr, V, or Ti and Fe on the surface of the material to be treated. This method, however, is disadvantageous in that if the amount of nitrogen is large, the rapid nitrification forms a fragile Fe—N layer or a diffusion layer at the lower portion of the nitride layer, which greatly lowers the toughness of the base metal. It is also disadvantageous in that since a large amount of Fe—N exists in the layer, the layer is poor in hardness and inferior in wear resistance, corrosion resistance and the like. Development of a treatment for forming a nitride which does not substantially contain Fe—N by controlling the nitrification reaction has therefore been demanded, but it is impossible to form a nitride layer having a thickness suitable for practical use and not substantially containing Fe—N at a temperature as low as not higher than 700° C.

SUMMARY OF THE INVENTION

Accordingly, it is an object of the present invention to eliminate the above-described problems in the related art and to provide a method for forming (on a material to be treated) a surface layer composed of the nitride or carbonitride of at least one element selected from the group consisting of Cr, V, Ti, etc., which is excellent in adhesion with the base metal and which does not substantially contain Fe—N, with efficiency and without causing, a strain to the base metal by a heat treatment at a low temperature by a very simple apparatus by appropriately controlling the amounts of activator and nitrogen-containing gas for obtaining the surface layer.

To achieve this end, in a first aspect of the present invention, there is provided a surface treatment of a metal material comprising the steps of:

disposing a treating agent composed of a refractory powder of alumina or the like, and a powder of at least one metal for forming a nitride or a carbide, or an alloy powder of at least one of these metals in a fluidized bed furnace; and introducing an inert gas into the fluidized bed furnace to fluidize the treating agent and to form a fluidized bed;

heating the fluidized bed furnace to a temperature of not higher than 700° C.;

intermittently supplying an activator of a halogenated ammonium salt at a rate of 0.001 to 5 wt %/hour based on the total amount of the treating agent into the fluidized bed;

disposing the metal material in the fluidized bed during or after any of the above steps; and thereby forming a layer of a nitride or carbonitride of at least one of the metals for forming a nitride or a carbide on the surface of the metal material.

According to the surface treatment provided in the first aspect of the present invention, it is possible to form a nitride layer composed of only a metal for forming a nitride which contains almost no Fe—N at a low temperature below 700° C. even though the material to be treated is an iron steel. The toughness of the base metal, which does not substantially contain Fe—N, is lowered only to a small extent. Although the reaction for forming the nitride layer is not clear, it is guessed to be as follows.

The halogenated ammonium salt which is intermittently supplied from the outside of the furnace is resolved into a hydrogen halide and ammonia (NH$_3$) at the high-temperature part in the furnace. The hydrogen halide reacts with the metal for forming a nitride which constitutes the fluidized bed and generates a halide of the metal. The metal halide reacts with the ammonia and generates a metal nitride, which is supposed to deposit on the surface of the material to be treated and form a layer.

In forming the nitride layer, by controlling the halogenated ammonium salt so as to be supplied at a rate of 0.001 to 5 wt %/hour based on the total amount of the treating agent, it is possible to form a thick nitride layer which has been considered to be impossible in the related art.

The method according to the first aspect of the present invention is characterized in that an N source which forms a nitride is not supplied from the outside of the furnace but that NH$_3$ generated by the decomposition of a halogenated ammonium salt within the furnace is used, as described above. Another characteristic feature is that a metal which forms a nitride is not supplied as a metal halide from the outside of the furnace but kept in the fluidized bed as a floating metal powder. In other words, since it is not necessary to supply a metal halide which has strong corrosiveness from the outside of the furnace, the apparatus is greatly simplified. The method has a great advantage in that since a metal for forming a nitride is uniformly dispersed in the fluidized bed, and the metal halide generated by the reaction of the metal for forming a nitride with the hydrogen halide generated by the decomposition of the halogenated ammonium salt which is carried out in the furnace uniformly generates in the fluidized bed, the nitride layer formed has a uniform thickness.

Furthermore, since the amount of nitrogen generated is small, the treating agent (inert particles, a metal for forming a nitride or the like) scarcely suffers from any trouble in the formation of a nitride or the like.

Since the material to be treated is heated at a low temperature, a strain is unlikely to be produced on the base metal, and the treatment at a low temperature leads to good workability and does not need a large amount of energy.

In the method provided in the first aspect of the present invention, since a halogenated ammonium salt as an activator is intermittently supplied into the fluidized bed from the outside in the process of surface treatment, continuous surface treatment is possible. Since an activator can be added gradually, the amount of halogenated gas exhausted from the fluidized bed is so small as to allow small-sized and simple waste gas treating equipment. The halogenated ammonium salt is very cheap. It is not necessary to exchange the treating agent over a long period of time, so that it is possible to reduce the amount of expensive metal used for forming a nitride or a carbide, such as Cr, Ti, and V.

As a metal for forming a nitride or a carbide used in this method, not only a pure metal but a low-priced alloy powder is usable, which is inexpensive in comparison with a metal halide or the like. These advantages constitute the conditions for a low running cost, so that they are industrially effective.

In a second aspect of the present invention, there is provided a surface treatment of a metal material comprising the steps of:

disposing a treating agent composed of a refractory powder of alumina or the like and a powder of at least one a metal for forming a nitride or a carbide, or an alloy powder of at least one of these metals in a fluidized bed-furnace; and introducing an inert gas into the fluidized bed furnace to fluidized the treating agent and to form a fluidized bed;

heating the fluidized bed furnace to a temperature of not; higher than 700° C.;

supplying to said fluidized bed a halide as an activator at a rate of 0.001 to 5 wt %./hour based on the total amount of said treating agent and a nitrogen-containing gas in an amount of 5 to 1000 mol % based on the amount of said halide; and disposing the metal material in the fluidized bed during or after any of the above steps;

thereby forming a layer of a nitride or carbonitride of at least one of the metals for forming a nitride or a carbide on the surface of the metal material.

In the surface treatment provided by the second aspect, the activator of a halide is so controlled as to be supplied at a rate of 0.001 to 5 wt %/hour based on the total amount of the treating agent, and the amount of nitrogen-containing gas which contributes to the formation of a nitride is controlled within the limits of 5 to 1000 mol % based on the amount of the halide. It is therefore possible to form a nitride layer composed of only a metal for forming a nitride which contains almost no Fe—N at a temperature as low as not higher than 700° C. even though iron steel is used as the material to be treated. The amount of nitrogen-containing gas is selected to be 5 to 1000 mol % based on the amount of the halide. If it is less than 5 mol %, the rate at which the nitride layer is formed is lowered. On the other hand, when an iron steel is used, if it is more than 1000 mol %, a fragile Fe—N layer or a diffusion layer is apt to the formed in the lower portion of the nitride layer, so that the toughness of the base metal is lowered, and further the nitrification of the metal for forming a carbide or the like or an alloy powder thereof itself is accelerated, which results in the deterioration of the treating agent, namely, lowering of the rate at which the nitride layer is formed. The reaction for forming the nitride layer is the same as in Example 1 except that an N source is supplied in the form of a nitrogen-containing gas from the outside of the furnace.

The characteristic feature of the second aspect of the present invention is that the amount of nitrogen-containing gas supplied is much smaller than that in the conventional treatment for forming a nitride by the aid of the chemical vapour deposition which uses a metal halide and a nitrogen-containing gas. Other characteristic features, the uniformity of the thickness of the surface layer, the simplicity of the apparatus, and the possibility of continuous treatment are similar to those in Example 1, description thereof being omitted.

DETAILED DESCRIPTION OF THE INVENTION

In the surface treatment according to the first aspect of the present invention, any metal material is usable as the material to be treated, for example, iron, copper, nickel, or an alloy thereof. Examples of the activator of a halogenated ammonium salt are $NH_4Cl$, $NH_4Br$, $NH_4F$, $NH_4I$, and $NH_4BF_4$. The preferred amount of activator added so as to obtain a surface treated layer of practical thickness is 0.001 to 5 wt %/hour based on the total amount of a refractory powder and a metal powder. Even with less than 0.001 wt % of an activator, it is possible to form a surface layer, but since the thickness of the layer is small, it is impossible to display an effect of forming a layer under some conditions. If the amount of activator exceeds 5 wt %, the degree of corrosion of the material to be treated may become great and insome cases the nitride layer or the like may be separated therefrom. The above-described amount of activator may be added irregularly at any time as occasion demands or it may be added regularly at appropriate intervals of from 10 seconds to 4 hours, for example.

Figure 1:
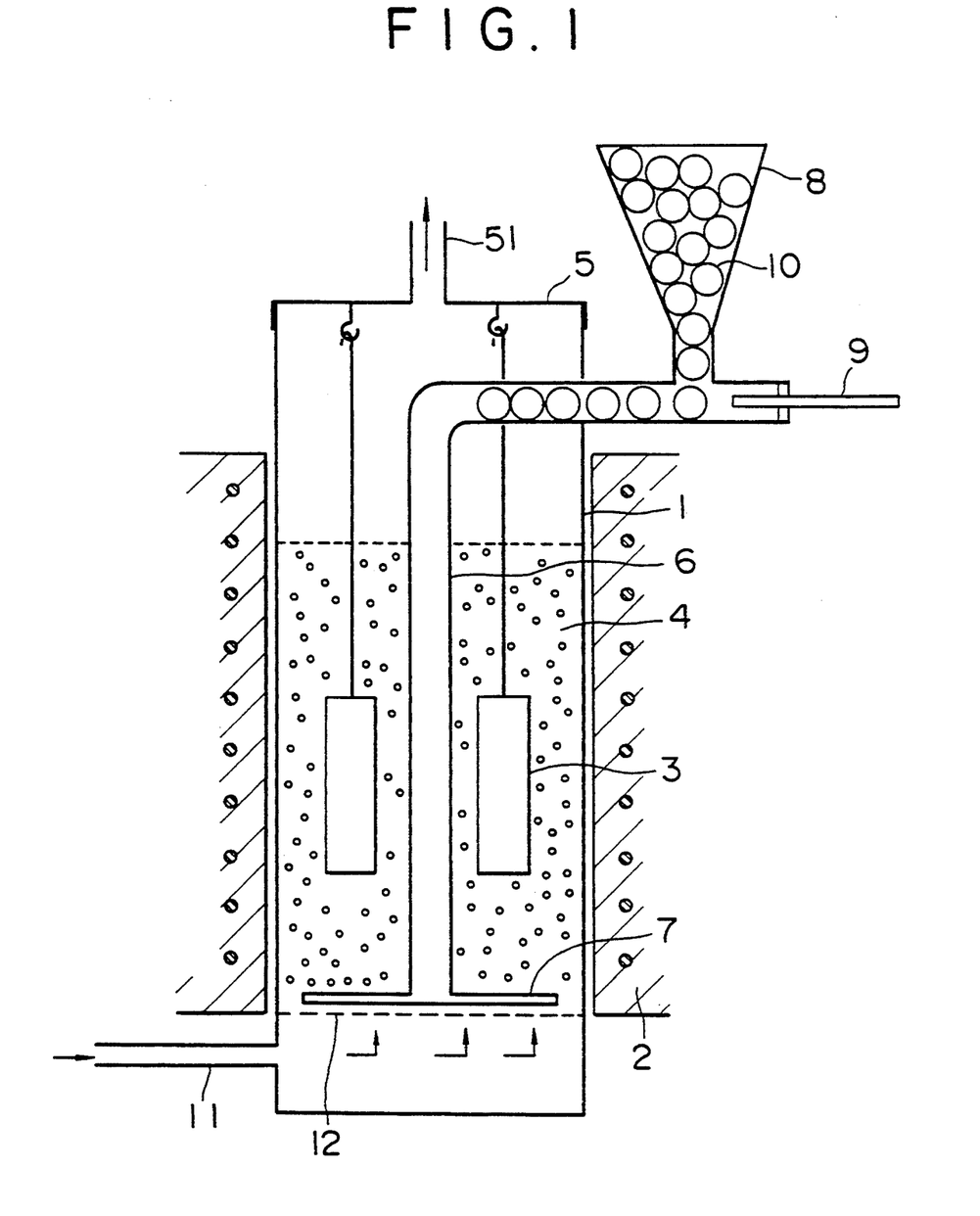
FIGS. 1, 2, and 3 are diagrams explaining the apparatus used in Examples 1 to 3 and 5 to 7.
Figure 2:
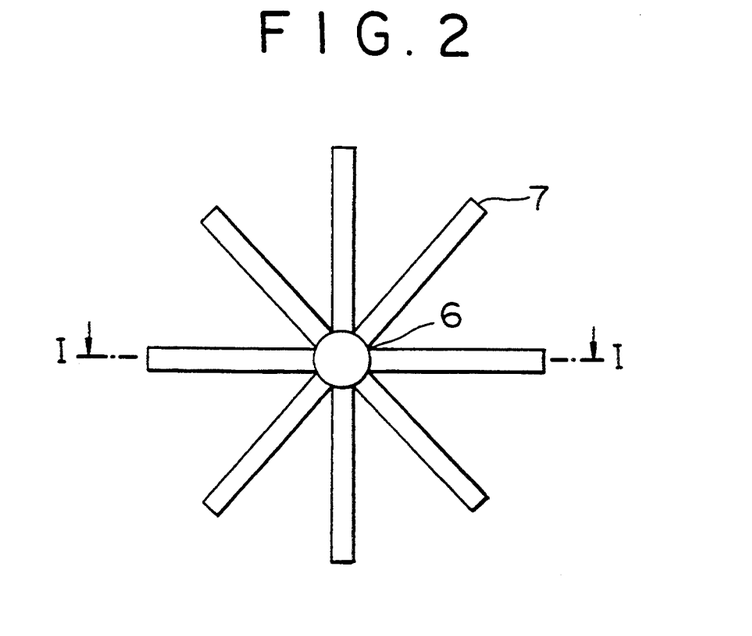
Figure 3:
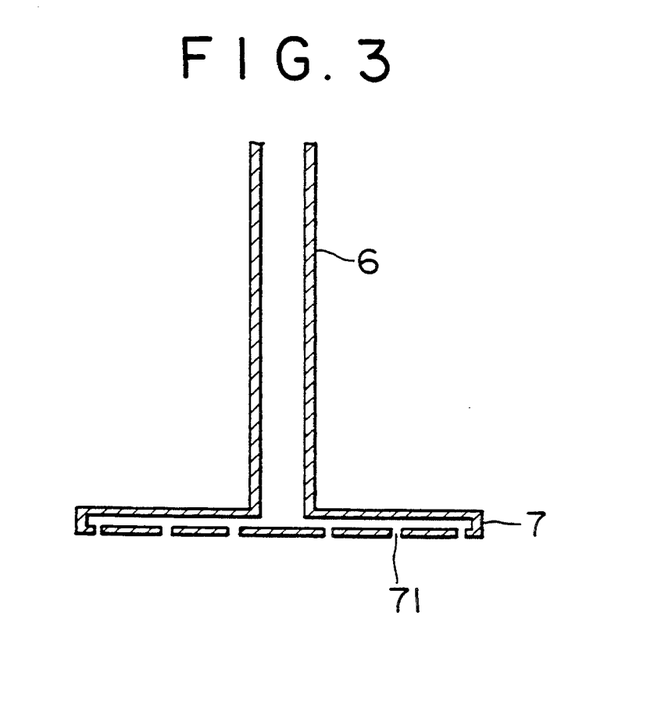

The activator is added by using, for example, supplying apparatus, such as that shown in FIG. 1. This apparatus, is composed of an activator supply pipe 6 and several distribution pipes 7, as shown in FIGS. 2 and 3, for example. This apparatus is disposed below a material to be treated 8 in a fluidized bed 4. Each of the distribution pipes 7 has a regular angle so as to make the flow of the gas uniform. If the ratio of "the sum of the sectional areas" of the pipe 6 and the pipes 7 which are vertical relative to the flow of the fluidized gas in the same plane to "the vertical sectional area of the fluidized bed" is too large, it is impossible to maintain the uniform flow. Within this range, it is possible to increase the diameter of the pipe 7 or to increase the number thereof. The cross sectional shape of the pipes 6 and 7 may be circle, ellipse, or square. The length of the pipe 7 is preferably selected so that the pipes 7 are as diametrically symmetric with respect to the center of the fluidized bed as possible. In the undersurface of the pipes 7 are formed a multiplicity of holes 71 for ejecting the activator therethrough. The number, diameter, and distribution of the holes are so determined as to maintain the uniformity of the gas in the fluidized bed. For example, it is recommended to shorten the diameters and to decrease the number of holes which are in the vicinity of the activator supply pipe than those which are distant. therefrom so as to make the density of the activator gas uniform on the cross section of the fluidized bed. The end portion of the activator supply pipe 6 is outside of the furnace, and it is provided with a hopper 8 for holding the activator. The activator stored in the hopper 8 in the form of pellets 10 or the like are pushed with a rod 9 and dropped though the activator supply pipe 6. The activator sublimes or evaporates beyond its sublimation or evaporation temperature. The pipe 6 is tightly closed so as to prevent the flow of the activator gas to the outside or the ingress of air. When the activator supplied reaches the high-temperature area of the supply pipe, the activator gas is exhausted from the ejecting holes 71 which are provided on the underside of the distribution pipes 7 by the volume expansion caused by sublimation or evaporation of the activator. In this case, in order to facilitate the flow of the gas, a gas, such as an inert gas, may be introduced into the pipe 6. The activator in the form of pellets which are pushed out may be gasified before being added into the furnace itself by providing a heater at a certain external part of the activator supply pipe 6. Since a halide is immediately gasified when added during a treatment or at a transient between the end of the treatment and the next treatment, the particle size of the halide is not so strictly limited and the halide may be added in the form of a pellet.

A refractory powder used for a treating agent is inert and does not react with a metal which constitutes the material to be treated. The refractory powder may be alumina ($Al'_2O_3$), oxidized silicon ($SiO_2$), oxidized titanium ($TiO_2$), zirconia ($ZrO_2$) or the like which are used in ordinary heat treatment. These refractory metals may be used either singly or in the form of a mixture.

A metal for forming a nitride or a carbide is a metal which easily forms a nitride or a carbide in combination with nitrogen or carbon. For example, it is Ti, Zr, Hf of the IVa group, V, Nb, Ta of the Va group and Cr, Mo and W of the VIa group of the periodic table and Mn. Iron alloys or the like, such as Fe—Cr, Fe—V, and Fe—Ti are usable as the alloys of these metals. These metals or alloys are used of one or more than two elements of the group. The amount of metal or alloy in the treatment agent is preferably 1 to 100 wt %. If it is less than 1 wt %, the thickness of the layer becomes small. At a low temperature below 700° C., 100 wt % of a metal or the like is usable because there is little possibility of gathering and growing solid.

A refractory powder and Cr, V or Ti or a metal powder including these elements preferably have a particle size of 60 to 350 mesh. With a particle size larger than 60 mesh, a large amount of fluidizing gas is required for fluidizing the treating agent, and the flow rate of the fluidizing gas becomes so high that the residence time of the gas generated from the halide in the fluidized bed is shortened, thereby increasing the amount of activator required to generate a gas from the halide in the fluidized bed. If the flow rate is too high, the gas generated from the halide is exhausted before it sufficiently reacts with the material to be treated, which obstructs the progress of the formation of the layer. With a particle size smaller than 350 mesh, the powder is difficult to handle because it is apt to float.

The fluidized bed furnace used in this surface treatment may be a fluidized bed furnace generally used for drying, incineration, reduction, etc. An example of such a furnace is shown in FIG. 1, which is provided with an inlet 11 for the fluidizing gas at its bottom and a gas diffuser plate 12 at a position close to the inlet in the furnace. The top of the furnace is covered with a lid 5 having gas exhaust port 51. It is also possible to provide the furnace integrally with the lid, to provide an activator distribution pipe or a door for inserting and taking out the material to be treated therethrough in such a manner as to be freely opened and closed. The heat treatment is carried out by heating the fluidized bed, which is a heating medium. As the heat treatment, either the fluidized bed furnace 1 including a fluidized bed may be inserted into an external heater 2 such as an electric furnace so as to heat the fluidized bed from the outside, or fluidized bed may be heated directly by a heater installed in the fluidized bed furnace.

The heat treatment as described above is carried out at a temperature of not higher than 700° C., because the base metal of the material to be treated is insusceptible to a strain at such a temperature. The lowest limit of the heat treatment temperature is preferably 400° C. Heat treatment at a temperature below 400° C. is slow to form a surface layer. For example, in the case of die steel and structural steel, the preferred heat treatment temperature is 500° to 650° C., which is tempering temperature thereof. The surface layer formed by the surface treatment of the present invention is composed of a layer of a nitride or carbon-nitride of Cr, V, Ti or the like which does not contain Fe—N. As a result, the surface layer is very solid and efficient in wear resistance, corrosion resistance and oxidation resistance. The surface layer becomes thicker as the heating time is increased. The heating time is determined according to the desired thickness of the surface layer. It is generally selected to be in the range from 1 to 100 hours. Practically, the coating layer is formed to a thickness of 0.1 to 20 μm.

As the fluidizing gas is used an inert gas such as argon. The fluidizing gas may be introduced continuously or intermittently. The latter case enables the reduction in gas consumption and the provision of a smooth treated surface.

Under some conditions, a treating agent powder might clog at the fluidizing gas inlet and check the normal fluidization. To prevent this trouble, coarse refractory particles (5 to 20 mesh), such as alumina particles may be interposed between the gas inlet and the treating agent powder.

In the surface treatment provided in the second aspect of the present invention, an activator of a halide used so as to form a coating layer is a hydrogen halide, such as HF, HCl, and HI, a halogenated ammonium salt such as $NH_4Cl$, $NH_4Br$, $NH_4F$, $NH_4I$, and $NH_4Br$, or a halide of an alkaline metal such as NaCl, KCl, $KBF_4$, and $NaBF_4$, or an alkaline earth metal. The amount of activator added is preferably 0.001 to 5 wt %/hour based on the total amount of the refractory powder and the metal powder as in the first embodiment. The halide is supplied in the form of a solid or a gas. In the case of supplying the halide in the form of solid, it is supplied in the same way as described in the first embodiment of the present invention. In the case of supplying the halide in the form of gas, it is supplied from the activator inlet 13 shown in FIG. 8.

A nitrogen-containing gas is used in order to form a carbonitride layer or a nitride layer. The gas is composed of a nitriding gas, such as ammonia, a mixed gas of a nitriding gas and a carburizing gas, such as methane and propane, or a mixed gas of a nitriding gas, a carburizing gas and an inert gas, such as Ar. A small amount of hydrogen may be added to the fluidizing gas. The purity of the gas may be an ordinary purity.

Figure 8:
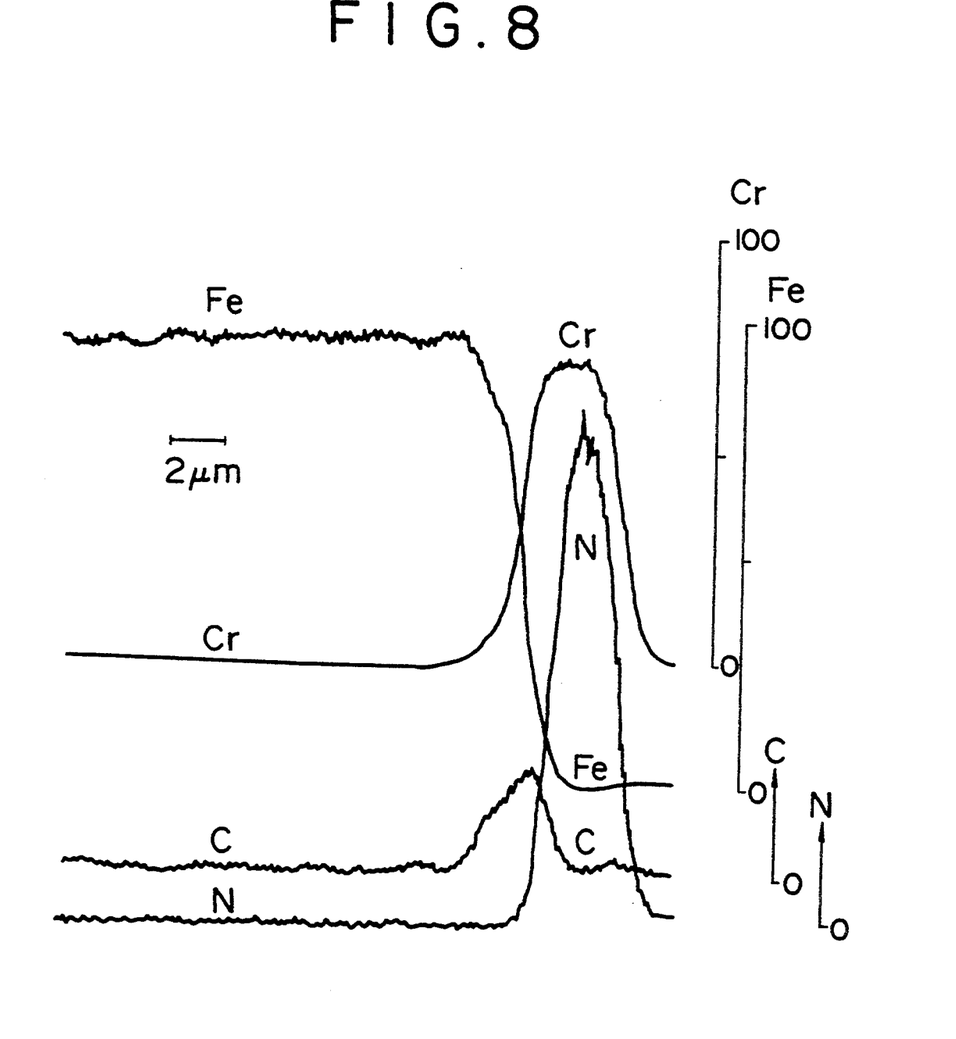

The preferred amount of nitrogen-containing gas supplied is 5 to 1000 mol % based on the amount of halide. If it is less than 5 mol %, the rate at which the nitride layer is formed is lowered. On the other hand, if it exceeds 1000 mol %, nitriding may occur to such an extent that a fragile Fe—N layer is formed in the lower portion of the surface layer when an iron steel is used, or nitrogen diffuses even into the metal material as the base metal, so that the toughness thereof is impaired. In addition, the life of the treating agent is shortened. A nitrogen-containing gas is supplied intermittently or continuously from the activator inlet 13, or supplied continuously from the fluidizing gas inlet 11. The amount of the nitrogen-containing gas supplied is much smaller than that in the conventional chemical vapour deposition or the like, and the apparatus is simplified and the operation is greatly facilitated.

The other treatment conditions are as described in the first embodiment and explanation thereof will be omitted.

Examples according to the present invention will be explained with reference to the following examples. It is to be understood, however, that the present invention is not limited by these examples within the scope of the invention.

EXAMPLE 1

A nitride layer was formed according to the present invention by using a fluidized bed furnace shown in FIG. 1. The furnace body 1 of the fluidized bed furnace is provided at its lower part with the gas inlet 11 for N gas used for fluidization, and directly above the opening of the inlet with the gas diffuser plate 12 which divides the furnace into two sections. On the top of the furnace body is placed the removable lid 5, which is provided with the exhaust port 51 leading to a scrubber which traps the exhaust gas.

The furnace body 1 is surrounded by a heater 2. The furnace body 1 is made of heat-resistant steel and it has a cylindrical shape 60 mm in diameter and 800 mm in height.

On the gas diffuser plate 12 of the fluidized bed furnace was placed 1 kg of a treating agent. The treating agent is composed of 60 wt % of alumina powder (80 to 100 mesh) and 40 wt % of chromium powder (100 to 200 mesh). $N_2$ gas was then introduced into the furnace body 1 through the gas inlet 11 as the fluidizing gas under a pressure of 1.5 kg/cm$^2$ at a flow rate of 140 cm/min. The treating agent powder became fluidized, thereby forming the fluidized bed 4. At the lower part of the fluidized bed 4, eight distribution pipes 7, as shown in FIGS. 2 and 3, are provided above the gas diffusion plate 12 in such a manner as to be connected to the activator supply pipe 6. The activator supply pipe 6 has an inner diameter of 9 mm, and the distribution pipes has an inner diameter of 3 mm. Three ejecting holes 71 0.5 mm in diameter for blowing out a gas therethrough are provided on the undersurface of each distribution pipe 7.

Three materials to be treated 3 (made of industrial pure iron, carbon steel JIS S45C, and high speed tool steel JIS SKH51, 7 mm in diameter and 50 mm in height) were suspended in the middle of the fluidized bed 4 by means of supporters attached to the inside of the lid. With the top of the furnace body 1 tightly closed with the lid 5, the fluidized bed 4 was heated to 570° C.

Figure 4:
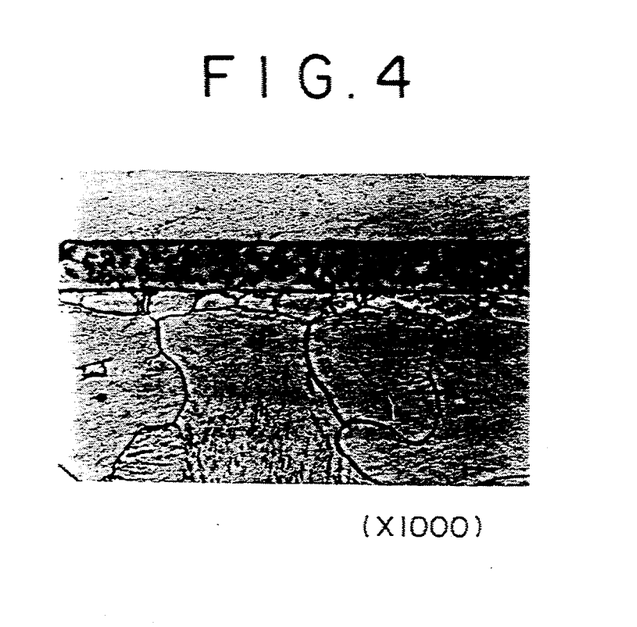
FIGS. 4 and 5, 7, 10, 11, and 12 show the metal structures of the cross sections of the surface layers formed in Examples 1, 3, 5, 6, and 7, respectively.
Figure 5:
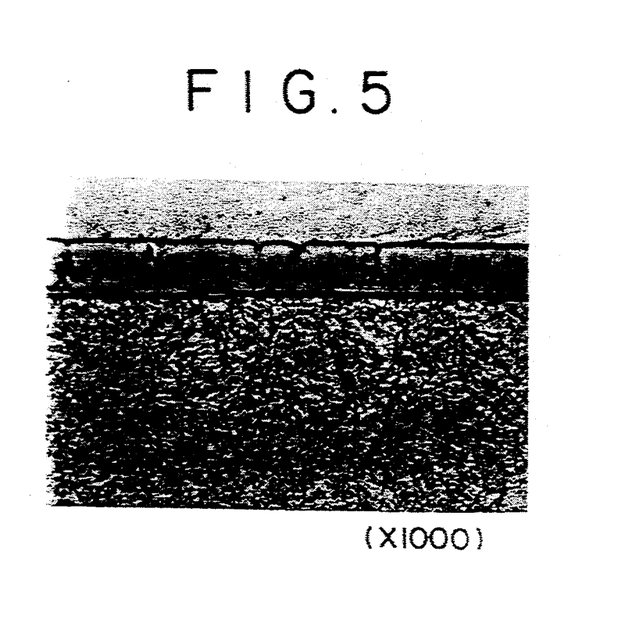
Figure 6:
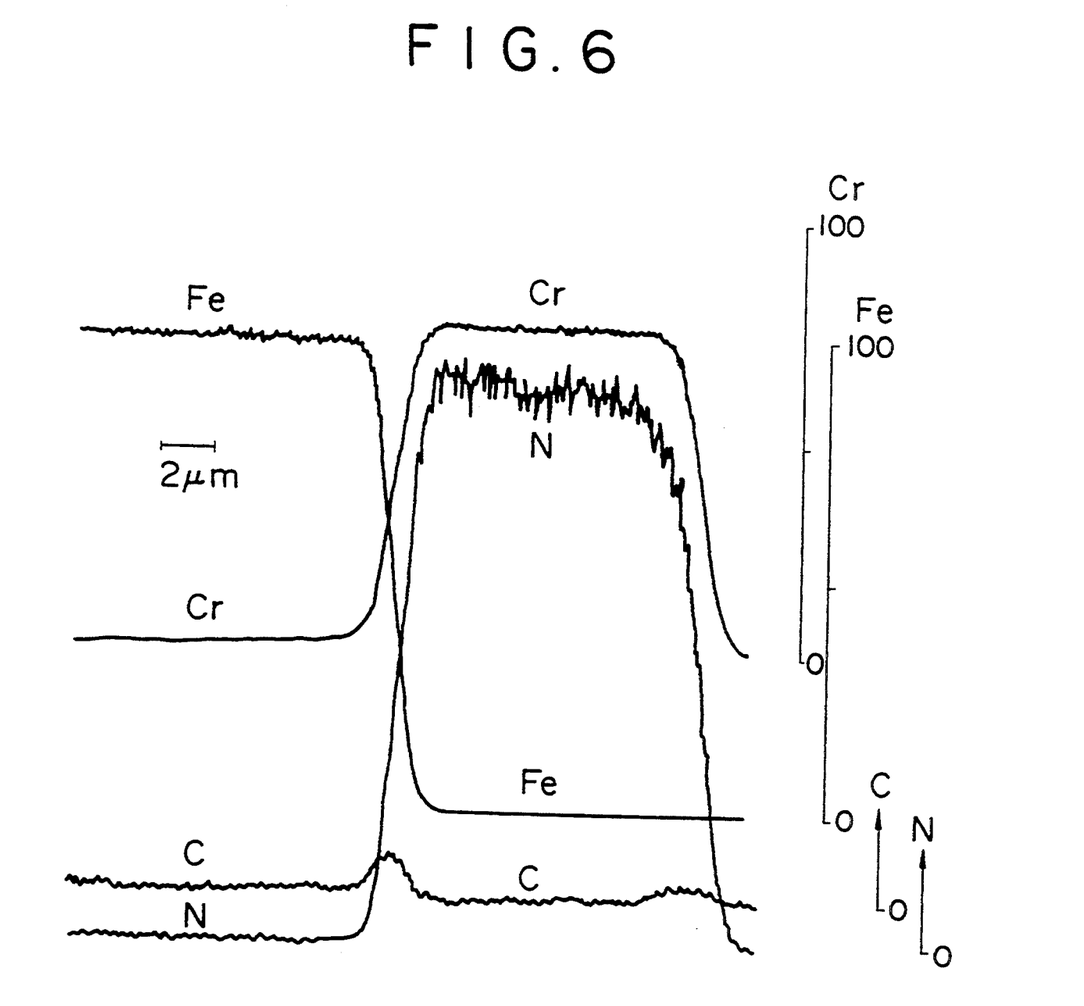
FIGS. 6 and 8 are diagrams showing the results of X-ray microanalyzer analyses of the surface of the iron alloy treated in Examples 1 and 3, respectively.

Ammonium chloride 10 (average weight 0.1 g/piece) in the form of a pellet was charged as an activator from the upper part of the hopper 8 for holding the activator, and after the top thereof was tightly closed, it was pushed and dropped into the activator supply pipe 6 with the rod 9 at an average rate of 20 pieces/hour. The weight of 20 pellets of ammonium chloride corresponds to 0.2 wt % of the total weight of the treating agent. After the treatment was carried out for 6 hours, the lid was removed and the materials to be treated were taken out of the furnace and quenched in oil. Another treatment was carried out for 50 hours in the same way. Upon visual inspection, the surfaces of the treated materials were found to be smooth, and free of adhesion of the treating agent and nonuniformity in color. It was confirmed from the microscopic observation of the cross section of the treated material that a coating layer was uniformly formed to a thickness shown in Table 1. FIGS. 4 and 5 show the metal structure of a cross section of the industrial pure iron and S45C, respectively, which were treated for 50 hours, By X-ray diffraction analysis, the coating layer was proved to be a chromium nitride (CrN) layer. As a result of X-ray analysis of the cross section of the sample by an X-ray microanalyzer, the presence of about 80 wt % of Cr in the coating layer with almost no iron was observed as shown, in FIG. 6.

In this way, by adding the activator at rate of 0.2%/hour as occasion demands, a chromium nitride of a thickness suitable for practical use was formed a at a low temperature, while protecting the material to be treated against corrosion by the activator.

TABLE 1

| Material to be treated | Treating time (hr) | Thickness of a nitride layer (m) |
|---|---|---|
| Industrial pure iron | 6 | 1 |
|  | 50 | 8 |
| S45C | 6 | 1 |
|  | 50 | 8 |
| SKH51 | 6 | 1 |
|  | 50 | 8 |

EXAMPLE 2

A nitride layer was formed by carrying out a treatment for 50 hours under the same conditions as in Example 1 except for using argon gas, as the fluidizing gas.

It was confirmed that a coating layer of about 8 mm thick was formed on the surface of each of industrial pure iron, S45C, and SKH51 which were materials to be treated. By X-ray diffraction analysis, the coating layer was proved to be a chromium nitride (CrN) layer.

As is clear from Example 2, when an activator generates a nitrogen-containing gas like ammonium chloride, it is possible to form a nitride layer on the surface of the material to be treated even though an inert gas, such as an argon gas, is used as the fluidizing gas.

EXAMPLE 3

A nitride layer was formed by carrying out a treatment for 6 hours under the same conditions as in Example 1 except that the fluidized bed was heated to 700° C., and that ammonium chloride (in an average amount of 0.1%/piece) in the form of a pellet was dropped into the activator Supply pipe at an average rate of 100 pieces/hour (corresponding to 1.0 wt % of the total amount of treating agent).

Figure 7:
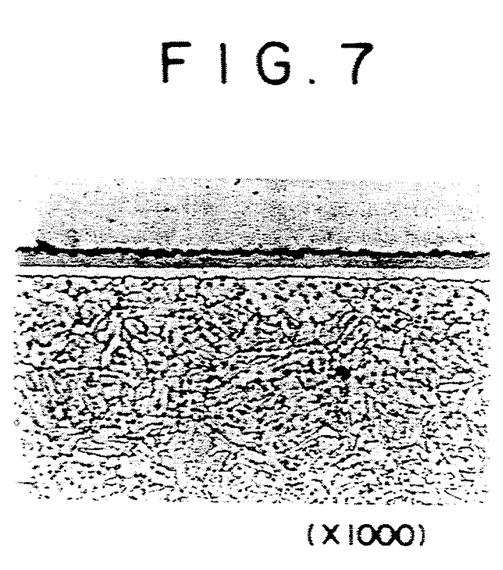

A two-layered coating layer composed of an inner layer and an outer layer was formed on the surface of S45C which was a material being treated, the cross section thereof being shown in FIG. 7. As a result of X-ray analysis of the cross section of the coating layer by an X-ray microanalyzer, the inner layer was an iron and chromium carbide layer and the outer layer was a chromium nitride layer. The outer layer, the chromium nitride layer, contains a slight amount of carbon.

In this way, when a nitride layer is formed on a material to be treated containing carbon according to the present invention, two layers consisting of a carbide inner layer and a nitride outer layer are formed.

EXAMPLE 4

Figure 9:
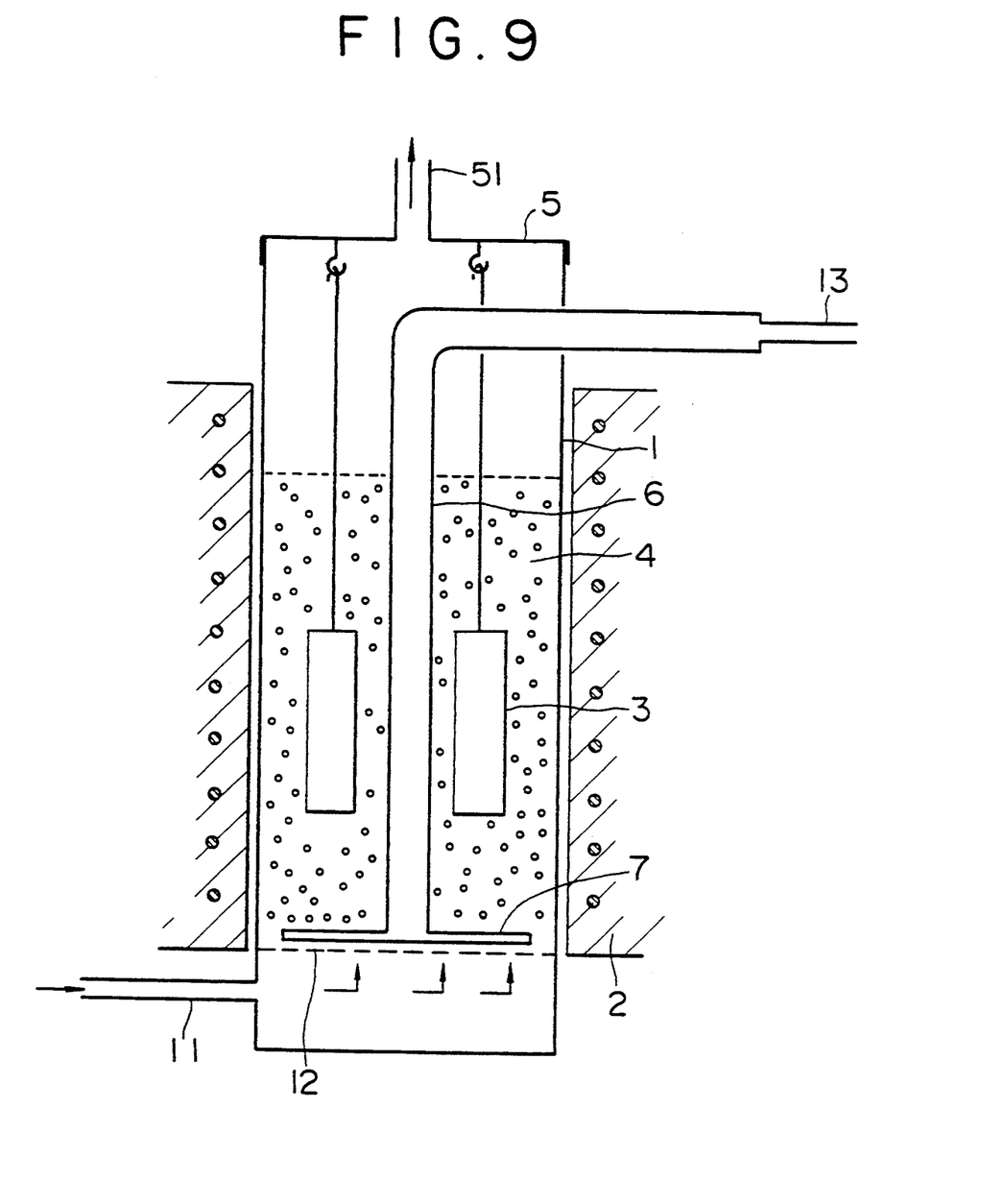
FIG. 9 explains the apparatus used in Example 4.

A nitride layer was formed according to the present invention by the fluidized bed furnace shown in FIG. 9 by using hydrogen chloride (HCl) as an activator and ammonia gas ($NH_3$) as a gas for forming a nitride. The fluidized bed furnace has approximately the same structure as the one shown in FIG. 1 except that the hopper 8 for holding the activator is replaced by an activator inlet 13 for introducing HCl and a gas for forming a nitride.

The composition and the amount of treating agent, the composition and the flow rate of the fluidizing gas, and the kind and the size of the material to be treated were the same as in Example 1. After the furnace was tightly closed, the fluidized bed was heated to 570° C.

HCl as an activator and NH₃ as a gas for forming a nitride were then supplied into the fluidized bed 4 in the form of a mixed gas through the activator supply pipe 6 from the activator inlet 13. HCl was supplied at a rate of 1.4 g/hour and NH₃ was supplied at a rate of 0.65 g/hour. After the treatment was carried out for 50 hours, the lid was removed and the materials to be treated were taken out of the furnace and quenched in oil. It was confirmed that a coating layer of about 8 μm thick was formed on the surface of each of industrial pure iron, S45C, and SKH51 which were materials to be treated. By X-ray diffraction and EPMA analyses, the coating layer was proved to be a chromium nitride (CrN) layer.

EXAMPLE 5

A nitride layer was formed by carrying out a treatment for 50 hours under the same conditions as in Example 1 except that treating agent is composed of 60 wt % of alumina powder (80 to 100 mesh) and 40 wt % of titanium powder (below 100 mesh).

It was confirmed that a coating layer of about 1 to 2 μm thick was formed on the surface of each of industrial pure iron, S45C, and SKH51 which were the materials to be treated.

Figure 10:
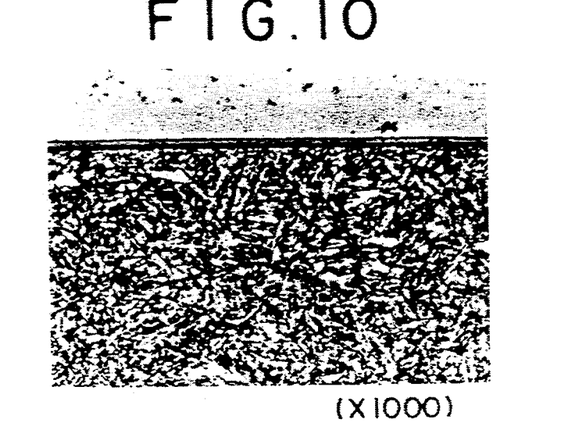

FIG. 10 shows the metal structure of a cross section of the coating layer formed on S45C. By X-ray diffraction and X-ray microanalyzer analyses, the coating layer was proved to be a cubic crystallized TiN which is a titanium nitride.

EXAMPLE 6

A nitride layer was formed by carrying out a treatment for 50 hours under the same conditions as in Example 1 except that the treating agent is composed of 60 wt % of alumina powder (80 to 100 mesh) and 40 wt % of Fe—V alloy powder (100 to 200 mesh, 80 wt %V).

It was confirmed that a coating layer of about 1 to 2 μm thick was formed on the surface of each of industrial pure iron, S45C, and SKH51 which were the materials to be treated.

Figure 11:
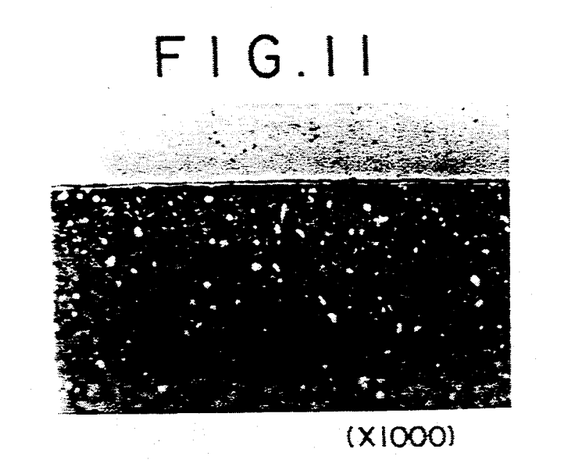

FIG. 11 shows the metal structure of a cross section of the coating layer formed on SKH51. By X-ray diffraction and X-ray microanalyzer analyses, the coating layer was proved to be a cubic crystallized VN which is vanadium nitride.

EXAMPLE 7

A composite nitride layer was formed by carrying a treatment for 10 hours under the same conditions as in Example 1 except that the treating agent was composed of 60 wt % of alumina powder (80 to 100 mesh), 31 wt % of chromium powder (100 to 200 mesh), and 9 wt % of titanium powder (below 100 mesh), and that HCl was supplied at a flow rate of 15 cc/min (1.4 g/hour) as an activator and NH₃ was supplied at a flow rate of 30 cc/min (1.3 g/hour) as a gas for forming a nitride.

It was confirmed that a coating layer of about 2 μm thick was formed on the surface of industrial pure iron, S45C, and SKH51 which were the materials to be treated.

Figure 12:
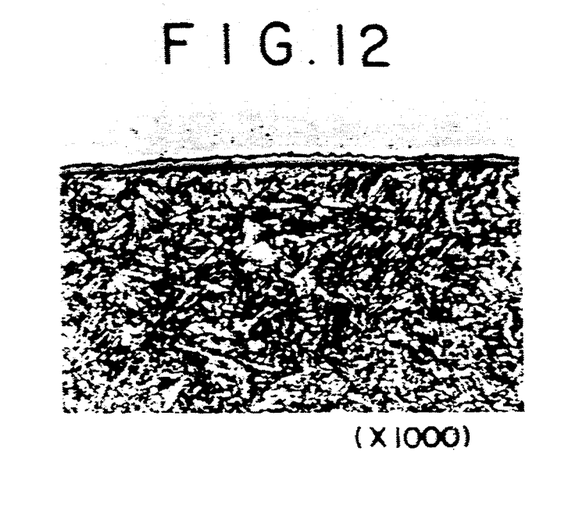

FIG. 12 shows the metal structure of a cross section of the coating layer formed on S45C. By X-ray microanalyzer analysis, the compositions of Cr, Ti, and N were as shown in Table 2.

In this way, by using several kinds of metal powders for forming a carbonitride as the treating agent, a composite nitride layer can be easily formed.

TABLE 2

| Analyzed element | Composition (wt %) |
|---|---|
| Cr | 73.9 |
| Ti | 4.5 |
| N | 21.5 |

What is claimed is:

1. A method of forming a nitride or carbonitride layer on a substantially FE—N— free surface of a metal material comprising the steps of:
   (a) disposing in a fluidized bed furnace a treating agent comprising a refractory powder and a powder of at least one material selected from the group consisting of metal for forming a nitride or a carbide and alloy of said metal; and introducing an inert gas into said fluidized bed furnace to fluidize said treating agent and to form a fluidized bed;
   (b) heating said fluidized bed furnace to a temperature of not higher than 700° C.;
   (c) intermittently supplying a halogenated ammonium salt as an activator to said fluidized bed at a rate of 0.001 to 5 wt % of salt per total amount of said treating agent per hour; and
   (d) disposing said metal material in said fluidized bed during or after said step (a), (b) or (c);
   thereby forming a layer of a nitride or carbonitride of at least one of said metals for forming a nitride or a carbide on the surface of said metal material.

2. A method according to claim 1, wherein said halogenated ammonium salt is at least one selected from the group consisting of ammonium chloride, ammonium bromide, ammonium fluoride, ammonium iodide, and ammonium fluoroborate.

3. A method according to claim 1, wherein said metals for forming a nitride or a carbide are IVa, Va or VIa metals of the periodic table and manganese.

4. A method according to claim 1, wherein the amount of said powder of at least one material in said treating agent is at least 1.

5. A method according to claim 1, wherein said inert gas is intermittently introduced into said fluidized bed furnace thereby to fluidize said treating agent intermittently.

6. A method according to claim 1, wherein the halogenated ammonium salt is the sole nitrogen source.

7. A method of forming a nitride or carbonitride layer on a substantially Fe—N-free surface of a metal material, the method consisting essentially of the following:
   (a) disposing in a fluidized bed furnace a treating agent comprising a refractory powder and a powder of at least one material selected from the group consisting of metal for forming a nitride or a carbide and alloy of said metal; and introducing an inert gas into said fluidized bed furnace to fluidize said treating agent and to form a fluidized bed;
   (b) heating said fluidized bed furnace to a temperature of not higher than 700° C.;
   (c) intermittently supplying a halogenated ammonium salt as an activator to said fluidized bed at a rate of 0.001 to 5 wt. % of salt per total amount of said treating agent per hour; and
   (d) disposing said metal material in said fluidized bed during or after said step (a), (b) or (c);

thereby forming a layer of a nitride or a carbonitride of the metal for forming a nitride or a carbide on the surface of said metal material.

8. A method of forming a nitride or carbonitride layer on a surface of a metal material comprising maintaining the surface substantially free from Fe—N while:

(a) disposing in a fluidized bed furnace a treating agent comprising a refractory powder and a powder of at least one material selected from the group consisting of metal for forming a nitride or a carbide and alloy of said metal; and introducing an inert gas into said fluidized bed furnace to fluidize said treating agent and to form a fluidized bed;

(b) heating said fluidized bed furnace to a temperature of not higher than 700° C.;

(c) intermittently supplying a halogenated ammonium salt as an activator to said fluidized bed at a rate of from 0.001 to 5 wt % of salt per total amount of said treating agent per hour; and (d) disposing said metal material in said fluidized bed during or after said step (a), (b) or (c);

thereby forming a layer of a nitride or carbonitride of at least one of said metals for forming a nitride or a carbide on the surface of said metal material.

* * * * *